United States Patent
Mueller et al.

(10) Patent No.: US 11,255,896 B2
(45) Date of Patent: Feb. 22, 2022

(54) METHOD FOR VEHICLE ELECTRICAL SYSTEM DIAGNOSIS

(71) Applicant: Robert Bosch GmbH, Stuttgart (DE)

(72) Inventors: Jonathan Mueller, Stuttgart (DE); Wolfgang Fischer, Renningen (DE)

(73) Assignee: Robert Bosch GmbH, Stuttgart (DE)

( * ) Notice: Subject to any disclaimer, the term of this patent is extended or adjusted under 35 U.S.C. 154(b) by 35 days.

(21) Appl. No.: 16/825,203

(22) Filed: Mar. 20, 2020

(65) Prior Publication Data

US 2020/0300903 A1 Sep. 24, 2020

(30) Foreign Application Priority Data

Mar. 22, 2019 (DE) .......................... 102019203927.8

(51) Int. Cl.
| | |
|---|---|
| *G01R 31/00* | (2006.01) |
| *B60R 16/023* | (2006.01) |
| *G01R 21/06* | (2006.01) |

(52) U.S. Cl.
CPC ........ *G01R 31/007* (2013.01); *B60R 16/0232* (2013.01); *G01R 21/06* (2013.01)

(58) Field of Classification Search
CPC ...... G01R 31/007; G01R 21/06; G01R 31/40; G01R 31/086; B60R 16/0232
USPC ....................................................... 324/503
See application file for complete search history.

(56) References Cited

U.S. PATENT DOCUMENTS

| | | | | |
|---|---|---|---|---|
| 6,122,576 | A * | 9/2000 | Ries-Muller | F02B 77/08 701/32.7 |
| 6,208,931 | B1 * | 3/2001 | Schoettle | B60W 50/0097 701/115 |
| 2006/0041765 | A1 * | 2/2006 | Taniguchi | B60L 7/10 713/320 |
| 2014/0333287 | A1 * | 11/2014 | Gupta | G01R 21/06 324/120 |
| 2015/0198634 | A1 * | 7/2015 | Brinlee | G01R 31/28 324/72.5 |
| 2015/0314740 | A1 * | 11/2015 | Reichow | H02J 1/08 701/36 |
| 2017/0179760 | A1 * | 6/2017 | Jawany | H02J 9/061 |
| 2017/0310260 | A1 * | 10/2017 | Schroth | H02P 9/48 |
| 2018/0029546 | A1 * | 2/2018 | Mohrmann | H02J 1/08 |
| 2019/0132917 | A1 * | 5/2019 | Veenstra | G01R 31/44 |

FOREIGN PATENT DOCUMENTS

DE 102005039362 3/2006

* cited by examiner

*Primary Examiner* — Tung X Nguyen
*Assistant Examiner* — Robert P Alejnikov, Jr.
(74) *Attorney, Agent, or Firm* — Michael Best & Friedrich LLP

(57) ABSTRACT

A method for vehicle electrical system diagnosis by means of a regulator, which is configured to regulate the voltage supplied by a generator via a converter for a vehicle electrical system of a vehicle by outputting an output signal, wherein the method comprises the following steps: detecting an output signal by way of a control device, ascertaining an instantaneous power output at the vehicle electrical system on the basis of the detected output signal, and analyzing the ascertained power output for diagnosis of the vehicle electrical system and at least one electrical consumer which is connected to the vehicle electrical system.

12 Claims, 4 Drawing Sheets

METHOD FOR VEHICLE ELECTRICAL SYSTEM DIAGNOSIS

BACKGROUND OF THE INVENTION

The present invention relates to a method for vehicle electrical system diagnosis in a motor vehicle, in particular in a motorized two-wheel vehicle, by means of a regulator, and a processing unit and a computer program for carrying out the method.

Motorized two-wheeled vehicles generally comprise an alternator or an AC or three-phase current generator, which is installed on the crankshaft or connected thereto and is used to charge the battery, which in turn supplies the vehicle electrical system of the vehicle with electric current. Since the alternating current or three-phase current supplied by the generator is not directly suitable for charging the battery, the current is converted via a downstream rectifier into direct current. Instead of a rectifier, a converter having semiconductor switches can also be installed, which can alternately operate as a rectifier or inverter and permits the generator to also be operated as a motor sometimes. In addition, it is necessary to regulate the generator power in order to maintain the target value of the charging voltage of the battery. Both functions are typically unified in a rectifier-regulator unit (also RR unit).

SUMMARY OF THE INVENTION

In particular, a method for vehicle electrical system diagnosis by means of a voltage regulator is proposed, which is configured to regulate the voltage supplied by a generator via a converter for a vehicle electrical system of a vehicle by outputting an output signal, wherein the method comprises the following steps: detecting an output signal of the voltage regulator by way of a control device, ascertaining an instantaneous power output at the vehicle electrical system on the basis of the detected output signal, and analyzing the ascertained power output for diagnosis of the vehicle electrical system and at least one electrical consumer which is connected to the vehicle electrical system. In this manner, a diagnosis of the vehicle electrical system may be carried out without significant interventions in the already existing components, by only the output signal of the voltage regulator being relayed to the control device. The control device can be a motor control unit or ABS (antilock braking system) control unit.

The analysis of the power output can be performed, for example, on the basis of items of information which are related to an instantaneous operating state of at least one of the electrical consumers. In this case, this can be, for example, a switching-on or switching-off signal of a consumer, which is recognized, for example, from the activation of the consumer or the detection of other signals (actuation of a switch, etc.). Items of information can also involve the expected or previous power consumption of a consumer, which can, for example, be stored suitably in a storage unit.

According to one embodiment, the detected output signal and/or a result value of the analysis and/or the instantaneous power output can be output via an interface, for example, to suitable diagnostic software or to further control units or to an external diagnosis device.

The analysis of the power signal can optionally also comprise a frequency component of the ascertained instantaneous power output being determined and a turn signal frequency of a vehicle turn signal connected as a consumer being determined on the basis of the determined frequency component.

Embodiments of the invention can be implemented using a converter, which comprises, for example, a diode rectifier or a semiconductor switch converter, for example, a transistor bridge circuit. The voltage regulator can be a regulator circuit, for example, a typical analog voltage regulator, or can also be a voltage regulator implemented by software in a control device. In this case, the control device which implements the voltage regulator and/or the above-mentioned method steps can be, for example, a motor control unit or ABS control unit.

A processing unit according to the invention, for example, a control unit of a motor vehicle, is configured, in particular by programming, to carry out a method according to the invention.

The implementation of a method according to the invention in the form of a computer program or computer program product having program code for carrying out all method steps is also advantageous, since this causes particularly low costs, in particular if an executing control unit is also used for further tasks and is therefore provided in any case. Suitable data carriers for providing the computer program are in particular magnetic, optical, and electrical memories, for example, hard drives, flash memories, EEPROMs, DVDs, etc. A download of a program via computer networks (Internet, intranet, etc.) is also possible.

Further advantages and designs of the invention result from the description and the appended drawing.

BRIEF DESCRIPTION OF THE DRAWINGS

The invention is schematically illustrated on the basis of exemplary embodiments in the drawing and will be described hereafter with reference to the drawing.

DETAILED DESCRIPTION

Figure 1:
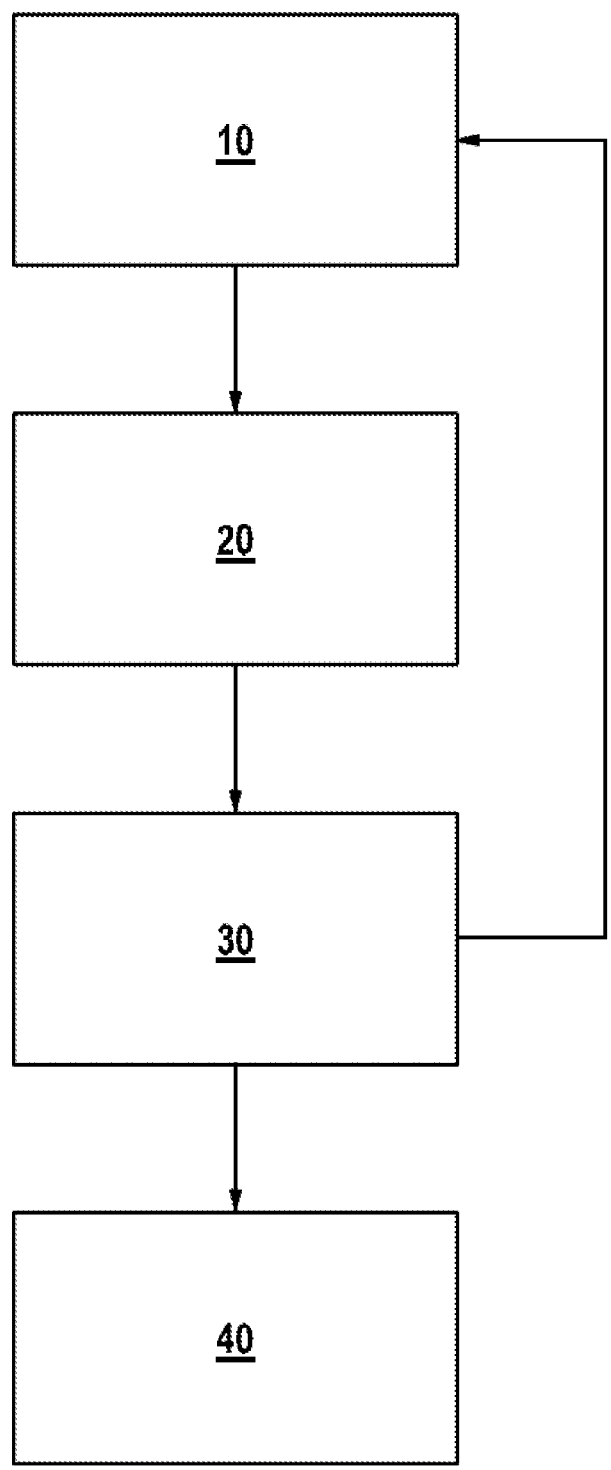
FIG. 1 shows a flow chart of an exemplary method of the invention.

According to one embodiment of the invention, the output signal of a voltage regulator is monitored, which regulates the output voltage of a generator in the vehicle. In this case, the instantaneous output power can be concluded from the output signal. The fundamental method sequence is shown as a diagram in FIG. 1; the output signal of the regulator is detected in step 10, and the power output is ascertained from this output signal in step 20. According to step 30, features of the vehicle electrical system and the connected consumers can be concluded by analysis of the output power. Finally, one or more signals or results from the preceding steps can be output at an interface in step 40. The detection of the output signal and the analysis can take place continuously, at regular intervals, or also only on demand.

In principle, the task of the voltage regulator is primarily to keep the voltage output at the battery and/or the vehicle electrical system of the vehicle essentially constant, i.e., within a predetermined range. The power of the generator is speed-dependent and thus changes continuously in operation. Even at uniform generator power (i.e., at uniform speed), the voltage will rise strongly at low power consumption without regulation and can thus exceed the predetermined charging voltage of the battery.

For example, if a consumer is connected to the system, the power consumption in the vehicle electrical system thus rises. To keep the charging voltage constant in relation, the voltage regulator will therefore permit a higher generator power. The connected consumers can therefore be concluded from the manipulated variable, i.e., the output signal of the voltage regulator. In the case of a few consumers or none at all, the output signal of the voltage regulator will be designed in such a way that the power is effectively limited, while in the case of many connected consumers in the vehicle electrical system, the voltage regulator will either increase the generator power or will limit less frequently or not at all, depending on the embodiment, so that the generator power is output longer.

Figure 2:
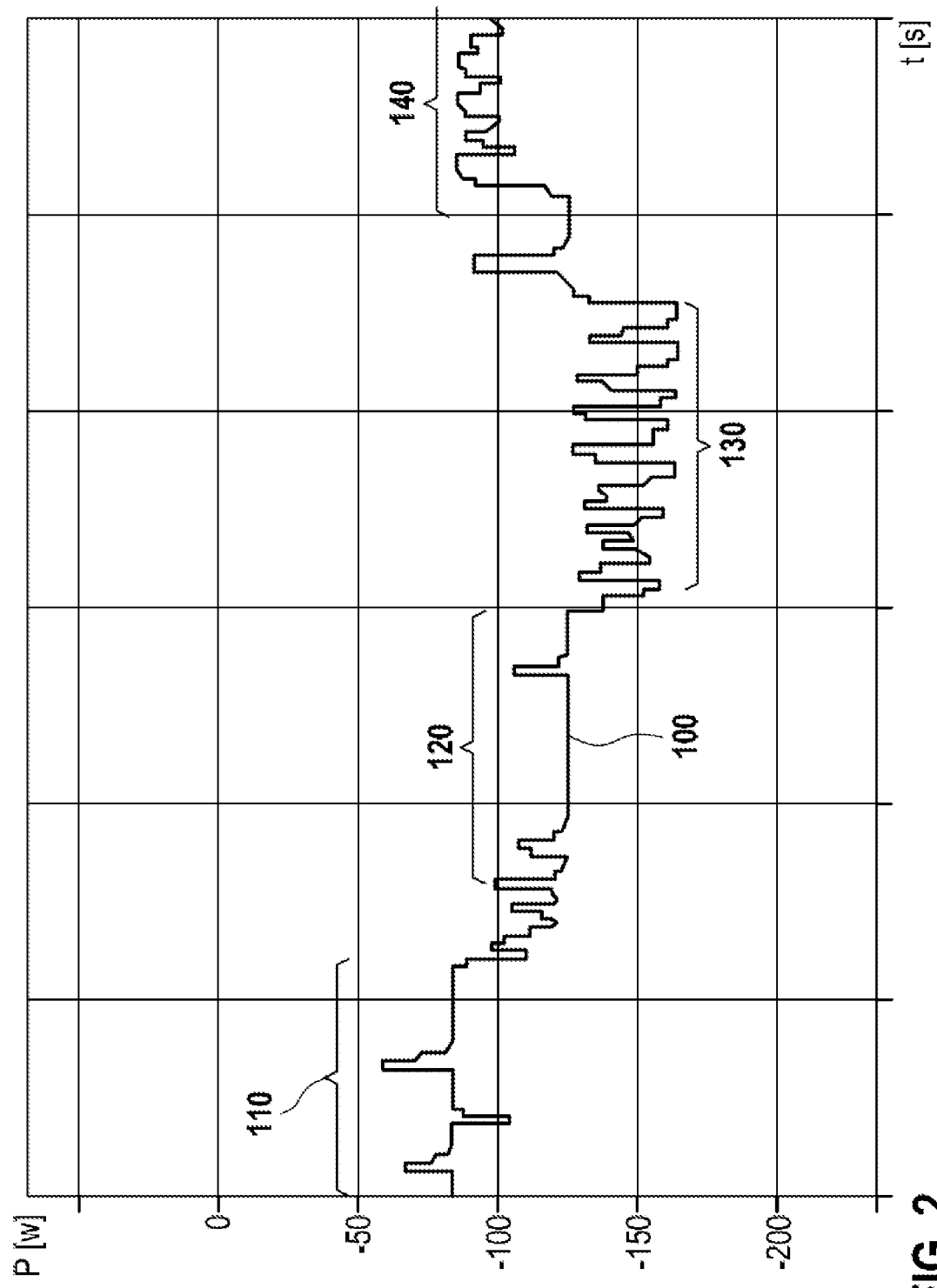
FIG. 2 shows the power output of an inverter computed from an output signal according to one embodiment of the invention.

FIG. 2 shows by way of example a time curve 100 of the output power P of the converter, which can be computed from the output signal of the regulator. In this case, initially no consumer is connected in a first range 110 and only the base consumption of the vehicle electrical system comes to bear. A step in the power curve is then apparent, which now represents a higher requested power 120, which can be explained by the switching on of a consumer (for example, the grip heater here). If the control device, which analyzes the output signal of the regulator, can also establish which elements or consumers are presently switched on, these can now be associated with the changed power curve. For this purpose, for example, the activation signals at the connected consumers can accordingly be compared to the ascertained power output, so that it can be established whether, for example, a detected switching-on signal of a first consumer corresponds to a corresponding change in the power output. In addition to the activation signals, further values with respect to the consumers could also be predetermined and/or stored, so that it can also be ascertained whether the power output corresponds to the expected value or deviates therefrom.

As a further element, a turn signal is then connected, which results in a new stepped range 130 in the power curve. In addition, at sufficient sampling frequency of the signal, it is clearly visible that it is a turn signal having periodically changing power consumption of the flashing light (on/off). A turn signal can optionally also already be recognized from its predetermined turn signal frequency, which can be extracted, for example, by a discrete Fourier transform (DFT) from the sampled output signals and/or the output power obtained therefrom.

Finally, the switching off of the consumer and the return to the base consumption can be seen on the power curve in range 140.

Various situations can thus be recognized on the basis of the measured output signal at the regulator. For example, it can thus be established overall whether the power is in a typical range, for example, on the basis of previously stored values or by comparison to earlier measured values, or whether leakage currents increase. Short-term measurements are possible, for example, for diagnosis of the vehicle electrical system, or also long-term detections of the output signal to make further statements therefrom. It can thus be established, for example, whether the base consumption or the power output of a specific consumer increases with time, or whether additional unknown consumers have been connected to the system. A defect of the generator or rectifier/converter can also be recognized.

Furthermore, it is possible to perform an optimization of the vehicle electrical system and the power supply by these diagnosis options. If the vehicle electrical system reaches the maximum capacity, individual consumers can be operated with elevated priority via the control device and others can be switched off, for example, grip heaters or sockets. In this manner, the system can also be operated reasonably using a smaller generator than otherwise provided and the costs of the system can thus be reduced accordingly.

The signals thus obtained and analyzed can be output at an interface for diagnosis. They can also be used further in a control device, for example, to intentionally actuate the consumers or perform other interventions in the vehicle electrical system, as described. In this case, both the output signal of the regulator directly and also the power output at the vehicle electrical system computed therefrom can be output. The results of an analysis, i.e., the ascertainment of the connected consumers and the present operational and functional status thereof, can also be output or used further accordingly. Further computations can also be performed, for example, the average power of the generator, the power consumption of the consumers in specific time intervals, or others.

Various systems, which are used as converters and regulators for a vehicle electrical system voltage and in particular a battery voltage, can be utilized for the application of this exemplary method.

Figure 3A:
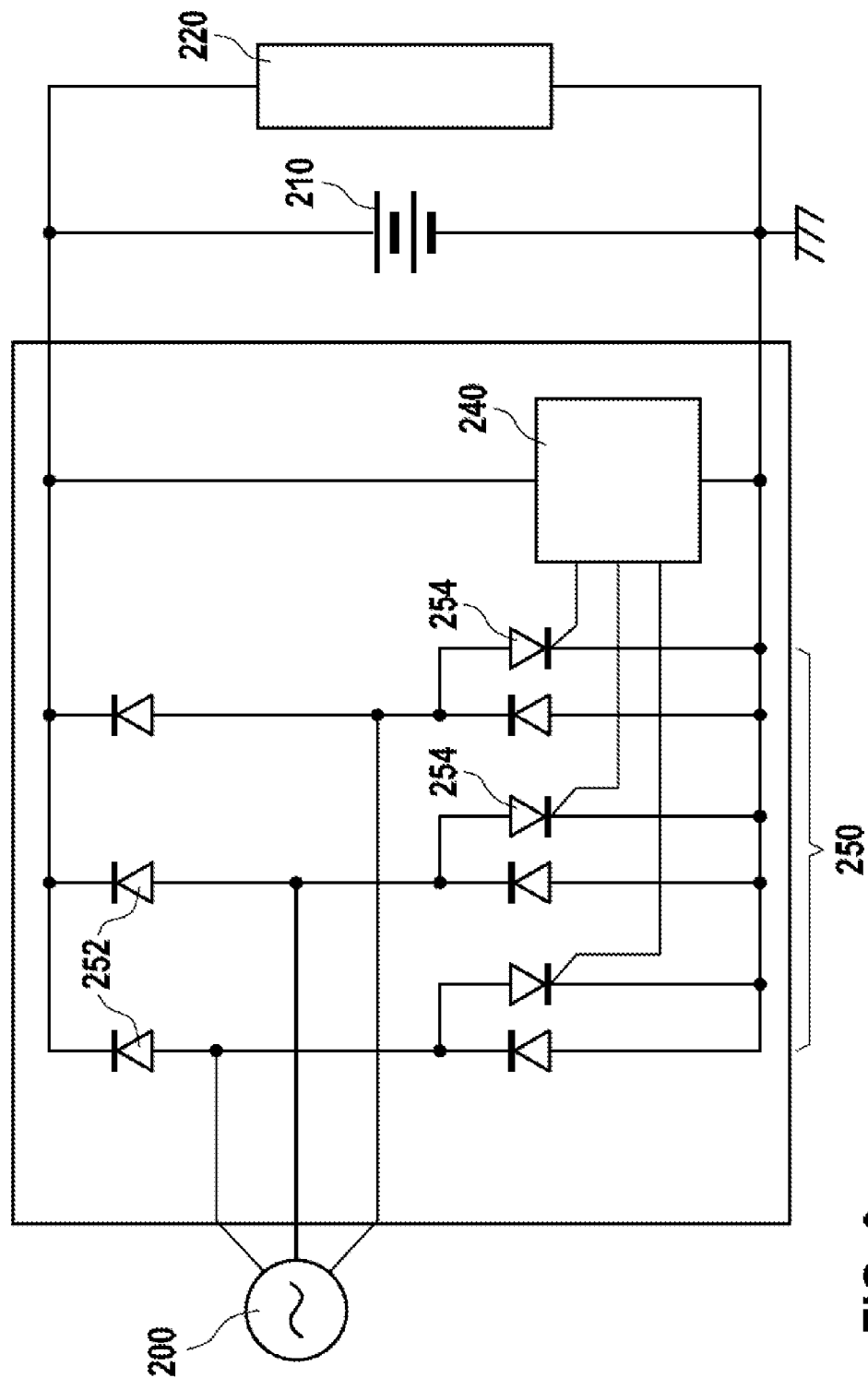
FIGS. 3a and 3b show exemplary inverter-regulator circuits which can be used in embodiments according to the invention.

For example, a typical rectifier-regulator unit having analog components can be utilized, as shown in FIG. 3a, and the output signal of a voltage regulator 240 of this unit can be transmitted to a control device. The three phases of a generator 200 are connected to diodes 252, which form a rectifier 250 for the three-phase current of the generator. The voltage regulator 240 actuates, for example, switches designed as thyristors 254, which regulate the voltage at the battery 210 and the vehicle electrical system 220 by short-circuiting the phases.

Figure 3B:
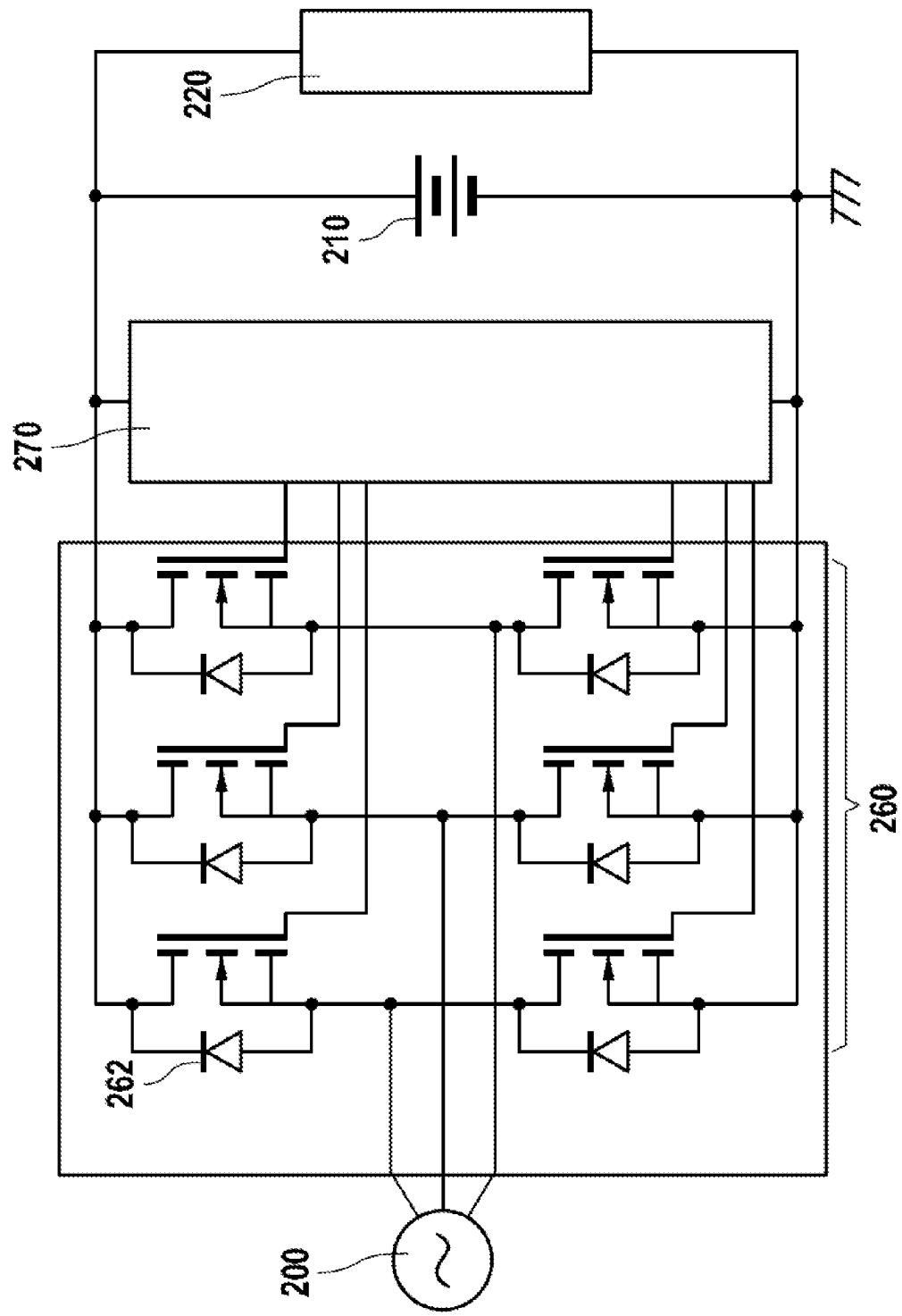

In other embodiments, as shown in FIG. 3b, a rectifier circuit or in general a converter 260 of arbitrary type can be combined with a control device 270, in which a voltage regulation is implemented on the software side and which is accordingly connected to the inputs and outputs of the converter 260. In this case, the converter can be, for example, a rectifier diode circuit as shown in FIG. 3a or, for example, a transistor bridge circuit 260 (for example, made of semiconductor switches, for example, MOSFETs 262), which is usable both as a rectifier and also as an inverter for the generator and is shown in FIG. 3b. A partial hybridization of the drive train may be achieved using the latter by optional use of the generator as a motor, since the motor can be connected as a drive element under specific conditions.

For the case of a diode rectifier 250 as in FIG. 3a, the limiting of the power for voltage regulation is typically achieved by thyristors 254, which temporarily short-circuit the phases of the generator 200. Alternatively, the rectifier can be temporarily disconnected, i.e., switched open or off. The output signal of the voltage regulator thus shows the charge and short-circuit phases of the rectifier (or the charge and open phases of the circuit, respectively), so that the power output to the vehicle electrical system 220 can be ascertained from the duty cycle between the two options. An equivalent circuit can also be obtained by not using diodes, but rather, for example, MOSFETs while employing the body diode; the voltage regulation can then also be achieved by short-circuit phases or switching open.

In a similar manner, in the case of a transistor circuit 260 acting as a rectifier and inverter, the regulator 270 will supply an output signal which acts on the transistor circuit 260 in such a way that the pole wheel angle is changed accordingly, generator operation prevails in the case of a positive pole wheel angle, while a negative pole wheel angle causes motor operation. The torque of the motor or the generator power, respectively, is dependent on the pole wheel angle.

Overall, the actually provided output signal at the regulator and also the computed relationship with the present vehicle electrical system power are dependent, of course, on the type of the rectifier and/or converter circuit, wherein many variants are possible. The method of the invention is finally not dependent on the variable which is output at the regulator output, as long as an inference about the presently required power output to the vehicle electrical system is possible from this variable, as already described. The detection of the output signal and the analysis can take place continuously, at regular intervals, or also only on demand.

The control device which assumes the analysis of the output signal can be the engine control unit of a vehicle, in particular of a motorized two-wheel vehicle. However, it is also possible that a separate control device or another control unit already provided on the vehicle assumes these tasks, for example, the ABS control unit. This also applies to the unit of the voltage regulator in the form of a software-side voltage regulator inside a control device; this control device can be identical to the one which assumes the analysis of the signals and consumption characteristic values, or these can be two separate arbitrary control devices. In particular, the voltage regulator can be designed as part of the engine control unit, for example, as a logic formed therein, wherein the digital activation signals are then transferred to the converter unit via a suitable line such as the wiring harness of the vehicle. As an example, the rectifier unit, as in FIG. 3a, can also comprise an actuator or switch for short-circuiting, which is activated by the regulator in a control device, for example, the engine control unit, wherein the positioning signal for the actuator is transmitted via a corresponding line such as the wiring harness of the vehicle.

The invention claimed is:

1. A method for vehicle electrical system diagnosis using a voltage regulator (240, 270), which is configured to regulate the voltage supplied by a generator (200) via a converter (250, 260) for a vehicle electrical system (220) of a vehicle by outputting an output signal, the method comprising:
   detecting (10) the output signal of the voltage regulator (240) by way of a control device (270), the output signal activating a switch to short-circuit or switch off the converter (250, 260);
   ascertaining (20) an instantaneous power output (100) at the vehicle electrical system (220) based on a duty cycle of the output signal of the voltage regulator (240), and
   analyzing (30) the ascertained power output (100) for diagnosis of the vehicle electrical system (220) and at least one electrical consumer which is connected to the vehicle electrical system.

2. The method according to claim 1, wherein the analysis is performed based on items of information related to an instantaneous operating state at least one electrical consumer.

3. The method according to claim 2, wherein the items of information comprise a switching-on or switching-off signal of the at least one electrical consumer.

4. The method according to claim 2, wherein the items of information comprise a power consumption of the at least one electrical consumer.

5. The method according to claim 2, wherein the items of information are stored in a storage unit in relation to an operating state of the at least one electrical consumer.

6. The method according to claim 1, the method further comprising outputting (40) the detected output signal and/or a result value of the analysis and/or the instantaneous power output (100) via an interface.

7. The method according to claim 1, the method further comprising:
   determining a frequency component of the ascertained instantaneous power output (130) and
   determining a turn signal frequency of a vehicle turn signal connected as the at least one electrical consumer based on the determined frequency component.

8. The method according to claim 1, wherein a pole wheel angle of the generator (200) is predetermined on the basis of the output signal.

9. The method according to claim 1, wherein the voltage regulator (240) is a voltage regulator implemented by software in the control device (270).

10. The method according to claim 1, wherein the control device is a motor control unit or ABS (antilock braking system) control unit.

11. A non-transitory, computer-readable storage medium containing instructions that when executed by a computer cause the computer in combination with a voltage regulator (240, 270), which is configured to regulate the voltage supplied by a generator (200) via a converter (250, 260) for a vehicle electrical system (220) of a vehicle by outputting an output signal, to:
   detect (10) the output signal of the voltage regulator (240, 270);
   ascertain (20) an instantaneous power output (100) at the vehicle electrical system (220) on the basis of the detected output signal, wherein
      the ascertainment of the power output is carried out on the basis of the duty cycle in the output signal, wherein the output signal activates a switch to short-circuit or switch off the converter (250, 260), and
   analyze (30) the ascertained power output (100) for diagnosis of the vehicle electrical system (220) and at least one electrical consumer which is connected to the vehicle electrical system.

12. A processing unit for vehicle electrical system diagnosis using a voltage regulator (240, 270), which is configured to regulate the voltage supplied by a generator (200) via a converter (250, 260) for a vehicle electrical system (220) of a vehicle by outputting an output signal, the processing unit being configured to:
   detect (10) the output signal of the voltage regulator (240) by way of a control device (270), the output signal activating a switch to short-circuit or switch off the converter (250, 260);
   ascertain (20) an instantaneous power output (100) at the vehicle electrical system (220) based on a duty cycle of the output signal of the voltage regulator (240), and
   analyze (30) the ascertained power output (100) for diagnosis of the vehicle electrical system (220) and at least one electrical consumer which is connected to the vehicle electrical system.

* * * * *